(12) United States Patent
Yoshimuta (10) Patent No.: US 8,357,909 B2
(45) Date of Patent: Jan. 22, 2013

(54) LIGHT OR RADIATION DETECTOR AND METHOD OF MANUFACTURING THE SAME

(75) Inventor: Toshinori Yoshimuta, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 460 days.

(21) Appl. No.: 12/738,315

(22) PCT Filed: Oct. 23, 2007

(86) PCT No.: PCT/JP2007/070609
§ 371 (c)(1),
(2), (4) Date: Apr. 16, 2010

(87) PCT Pub. No.: WO2009/054042
PCT Pub. Date: Apr. 30, 2009

(65) Prior Publication Data
US 2010/0243893 A1    Sep. 30, 2010

(51) Int. Cl.
*G01T 1/20* (2006.01)
(52) U.S. Cl. .......... 250/370.08; 250/370.09; 250/370.12
(58) Field of Classification Search ............. 250/370.08, 250/370.09, 370.12
See application file for complete search history.

(56) References Cited

U.S. PATENT DOCUMENTS

| 6,559,451 B1 * | 5/2003 | Izumi et al. .............. 250/370.08 |
| 6,724,855 B2 | 4/2004 | Sugawara et al. |
| 2005/0184244 A1 * | 8/2005 | Yoshimuta et al. ...... 250/370.01 |

FOREIGN PATENT DOCUMENTS

| JP | 2003-46075 A | 2/2003 |
| JP | 2004-268271 A | 9/2004 |
| JP | 2005-241334 A | 9/2005 |

* cited by examiner

*Primary Examiner* — David Porta
*Assistant Examiner* — Casey Bryant
(74) *Attorney, Agent, or Firm* — Cheng Law Group, PLLC (57) ABSTRACT

In the light or radiation detector of this invention, each of the molding structure, the first member, and the second member is formed such that the molding structure to protect the conversion layer and voltage application electrode has the resistance higher than the first member composed of the planar conductive buffer that is laminated on the (light or radiation) incident surface side of the molding structure, and that the first member mentioned above has the resistance higher than the second member composed of the planar conductive member that is laminated on the incident surface side of the first member. Consequently, occurrence of the noise from the static electricity may be suppressed.

7 Claims, 4 Drawing Sheets

LIGHT OR RADIATION DETECTOR AND METHOD OF MANUFACTURING THE SAME

TECHNICAL FIELD

This invention relates to light or radiation detectors for use in the medical, industrial, nuclear and other fields and method of manufacturing the detectors.

BACKGROUND ART

An X-ray detector will be described by way of example. The X-ray detector includes an X-ray conversion layer of an X-ray sensitive type. The detector detects X-rays by converting X-rays into electric charge information with the X-ray conversion layer upon incidence of the X-rays and reading out the electric charge information converted. Since the electric charges converted from the X-rays with the X-ray conversion layer are extremely small, the electric charges need to be amplified. The extremely small electric charges may occur not only from the X-rays but also changes in static electricity. Thus, where an electric potential change occurs from static electricity with respect to signal lines such as data lines at a previous stage of an amplifier, the change in the static electricity is identified as a signal by mistake to be amplified altogether. This results in occurrence of noise. There is a technique in which dummy lines to reduce influences of such static electricity are arranged in the thin film transistor (TFT) itself, thereby suppressing noise from the static electricity (see, for example, patent document 1.)

Here, according to a direct conversion type X-ray detector configured to convert incident radiation directly into charge information with an X-ray conversion layer, electric charges are generated with the X-ray conversion layer upon incidence of X-rays. In that case, it is necessary to apply a high bias voltage (for example, around several hundreds V to several tens kV) to the X-ray conversion layer. Electric discharge needs to be prevented for application of a high voltage. Thus, measures will be taken such as covering of the conversion layer with an insulator generally called a "molding structure." A frame is provided around the perimeter of the X-ray conversion layer or voltage application electrode, and an insulator such as a glass is placed on the frame. Subsequently, an insulating resin is poured into a space between the X-ray conversion layer or voltage application electrode and the glass for sealing. Such a configuration is general and leads to covering and protecting of the X-ray conversion layer or voltage application electrode with the insulating resin.

No electric discharge will occur in an applying surface of the voltage application electrode covered with the insulator such as the molding structure. On the other hand, static electricity will occur in an incidence surface (i.e., an opposed surface of the applying surface) of the molding structure. Consequently, the amplifier amplifies the change in the static electricity altogether, as mentioned above, leading to occurrence of noise. Such molding structure includes a technique to remove the static electricity using a conductive member grounded instead of the glass, thereby suppressing occurrence of the noise from the static electricity (see, for example, patent document 2.)

There is another technique in which the grounded conductive member is arranged between a photo-timer and X-ray detector for blocking of radiation noise from the photo-timer and dissipating the radiation noise through the ground (see, for example, patent document 3.)

[Patent Document 1]
  JP2003-46075A1 (Page 2 to 11, FIG. 1)
[Patent Document 2]
  JP2004-268271A1 (Page 1 to 9, FIG. 1)
[Patent Document 3]
  JP2005-241334A1 (Page 1 to 6, FIGS. 2, 3)

DISCLOSURE OF THE INVENTION

Problem to be Solved by the Invention

However, a problem arises that all static electricity occurred cannot be removed with only measure as patent document 2 mentioned above. Particularly, the applying surface of the high voltage application electrode is maintained charged, thereby gathering dust like a collector. The dust results in occurrence of the additional noise from the static electricity.

This invention has been made regarding the state of the art noted above, and its object is to provide a light or radiation detector capable of suppressing noise from static electricity and a method of manufacturing the detector.

Means for Solving the Problem

This invention provides the following construction in order to achieve the above object. A light or radiation detector of this invention is a light or radiation detector to detect light or radiation, including a conversion layer to convert information on the light or radiation into charge information upon incidence of the light or radiation, a voltage application electrode to apply a bias voltage to the conversion layer, a molding structure to protect the conversion layer and the voltage application electrode, and a read-out substrate to read the charge information, the light or radiation detector further including a first member composed of a planar conductive buffer that is laminated on a side of the incident surface of the molding structure, and a second member composed of a planar conductive member that is laminated on a side of the incident surface of the first member, each of the molding structure, the first member, and the second member being formed such that the molding structure has resistance higher than the first member and the first member has resistance higher than the second member.

According to the light or radiation detector of this invention, each of the molding structure, the first member, and the second member is formed such that the molding structure to protect the conversion layer and voltage application electrode has the resistance higher than the first member composed of the planar conductive buffer that is laminated on the (light or radiation) incident surface side of the molding structure, and that the first member mentioned above has the resistance higher than the second member composed of the planar conductive member that is laminated on the incident surface side of the first member. Static electricity occurred in the molding structure may be dissipated to the first member and further to the second member using a phenomenon in which static electricity flows from a higher resistance to a lower one, thereby leading to removal of the static electricity occurred in the molding structure. Moreover, the planar structure of each member results in gradual removal of the static electricity. Furthermore, the first member between the molding structure and second member is a buffer, and thus improved adhesion may be realized. Where a first member is composed of a thin film such as a tape, an amount of read signals slightly decreases and electric lines of force concentrate, which results in an increased risk of electric discharge. In contrast, the first member is composed of the buffer, an amount of read signals never decreases and the electric lines of force never concentrate, which leads to no risk of the electric discharge. As a result, suppression may be made of occurrence of the noise from the static electricity.

With the light or radiation detector mentioned above, the molding structure is preferably of resistance in a range of 1 MΩ to 100 MΩ, inclusive, the first member preferably of 0.5 KΩ to 10 MΩ, inclusive, and the second member preferably of 0.1 KΩ to 1 MΩ, inclusive. Each resistance lower than the above range leads to a large amount of movement of the static electricity, and thus sudden changes thereof may occur. Each resistance higher than the above range makes it difficult to completely remove the static electricity charged. Consequently, the static electricity is likely to be constantly charged, leading to rise of the electric potentials, conversely. That is, a similar phenomenon occurs as the static electricity is charged in the molding structure, which results in impossibility to suppress influences of the noise from the static electricity. On the other hand, with each resistance within the range mentioned above, the static electricity may be removed while the movement speed thereof being moderately suppressed, leading to reduction in changes of the static electricity. Consequently, occurrence of the noise may be suppressed.

The light or radiation detector mentioned above is preferably configured such that the second member mentioned above is grounded. With such configuration, the static electricity dissipated into the second member may be dissipated through the grounded portion, and noises rather than from the static electricity may also be suppressed.

The light or radiation detector mentioned above is useful to apply a direct conversion type radiation detector. Specifically, the conversion layer is of a radiation sensitive type that directly converts the information on radiation into charge information, and the detector is a direct conversion type radiation detector having the radiation sensitive type conversion layer. In the direct conversion type radiation detector, a higher bias voltage (for example, around several hundreds V to several tens kV) is applied to the voltage application electrode, and therefore to the conversion layer. Consequently the static electricity is likely to be generated in the molding structure. With this invention, however, the static electricity occurred in the molding structure may be removed to suppress the noise from the static electricity.

This invention also relates to a method of manufacturing a light or radiation detector to detect light or radiation, the detector including a conversion layer to convert information on the light or radiation into charge information upon incidence of the light or radiation, a voltage application electrode to apply a bias voltage to the conversion layer, a molding structure to protect the conversion layer and the voltage application electrode, and a read-out substrate to read the charge information, the method including the steps of laminating a first member composed of a planar conductive buffer on a side of the incident surface of the molding structure, and laminating a second member composed of a planar conductive member on a side of the incident surface of the first member, each of the molding structure, the first member, and the second member being formed such that the molding structure has resistance higher than the first member and the first member has resistance higher than the second member.

According to the method of manufacturing the light or radiation detector of this invention, the method includes the steps of laminating the first member composed of the planar conductive buffer on the (light or radiation) incident surface side of the molding structure, and laminating the second member composed of the planar conductive member on the incident side of the first member. Moreover, each of the molding structure, the first member, and the second member is formed such that the molding structure has the resistance higher than the first member mentioned above, and that the first member has the resistance higher than the second member mentioned above. Consequently, occurrence of the noise from the static electricity may be suppressed.

In the method of manufacturing the light or radiation detector mentioned above, the molding structure is preferably configured so as to have resistance higher than the first member by atomization of an object to be applied by spraying and application thereof to the incident surface of the molding structure. Through atomization of the object to be applied by spraying and application thereof to the incident surface of the molding structure, the light or radiation to be detected can enter with no block by the molding structure. Repeat is preferably made of a process to apply the object to be applied by spraying and application thereof. Through the repeat of the process to apply the object to be applied by spraying and application thereof, the molding structure may be configured having a specific thickness and resistance with a specific value.

Effect of the Invention

With the light or radiation detector and the method of manufacturing the detector according to this invention, each of the molding structure, the first member, and the second member is formed such that the molding structure to protect the conversion layer and voltage application electrode has the resistance higher than the first member composed of the planar conductive buffer that is laminated on the (light or radiation) incident surface side of the molding structure, and that the first member mentioned above has the resistance higher than the second member composed of the planar conductive member that is laminated on the incident surface side of the first member. Consequently, occurrence of the noise from the static electricity may be suppressed.

DESCRIPTION OF REFERENCES

30 . . . radiation detector
31 . . . semiconductor thick film
32 . . . voltage application electrode
36 . . . insulating substrate
44 . . . molding structure
44a . . . antistatic coating film
45 . . . conductive sponge
46 . . . conductive carbon member

EMBODIMENT

Figure 1:
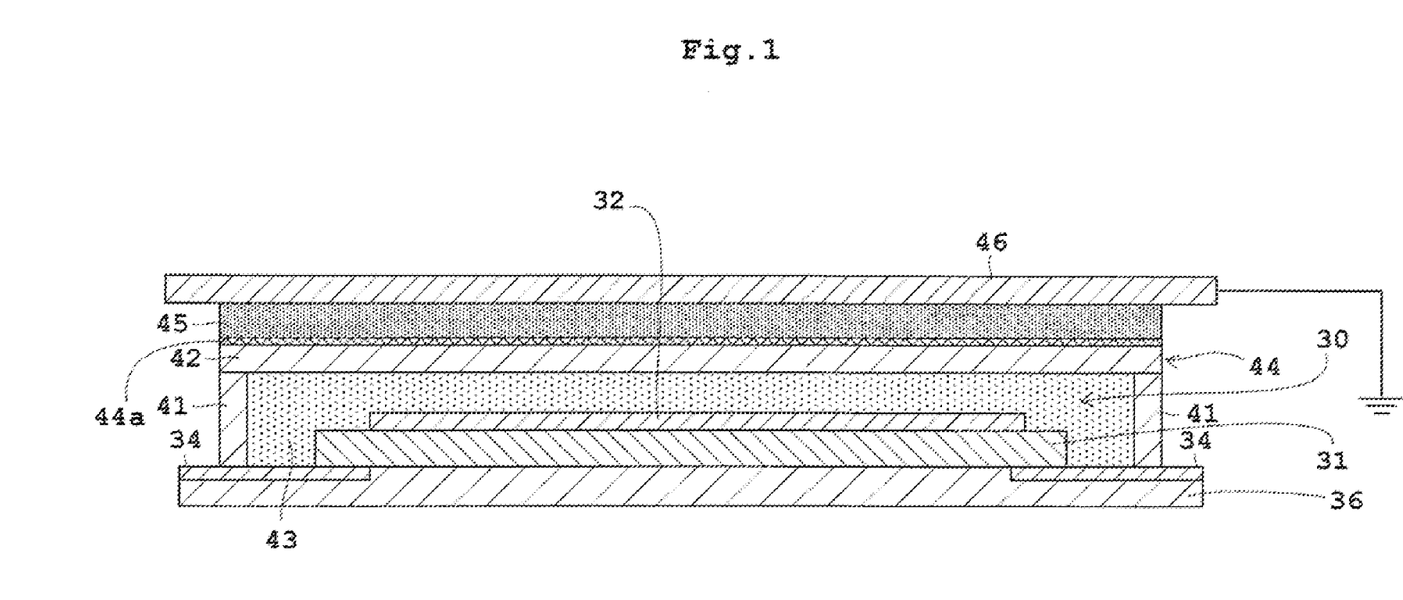
FIG. 1 is a schematic sectional view of a radiation detector according to Embodiment.
Figure 2:
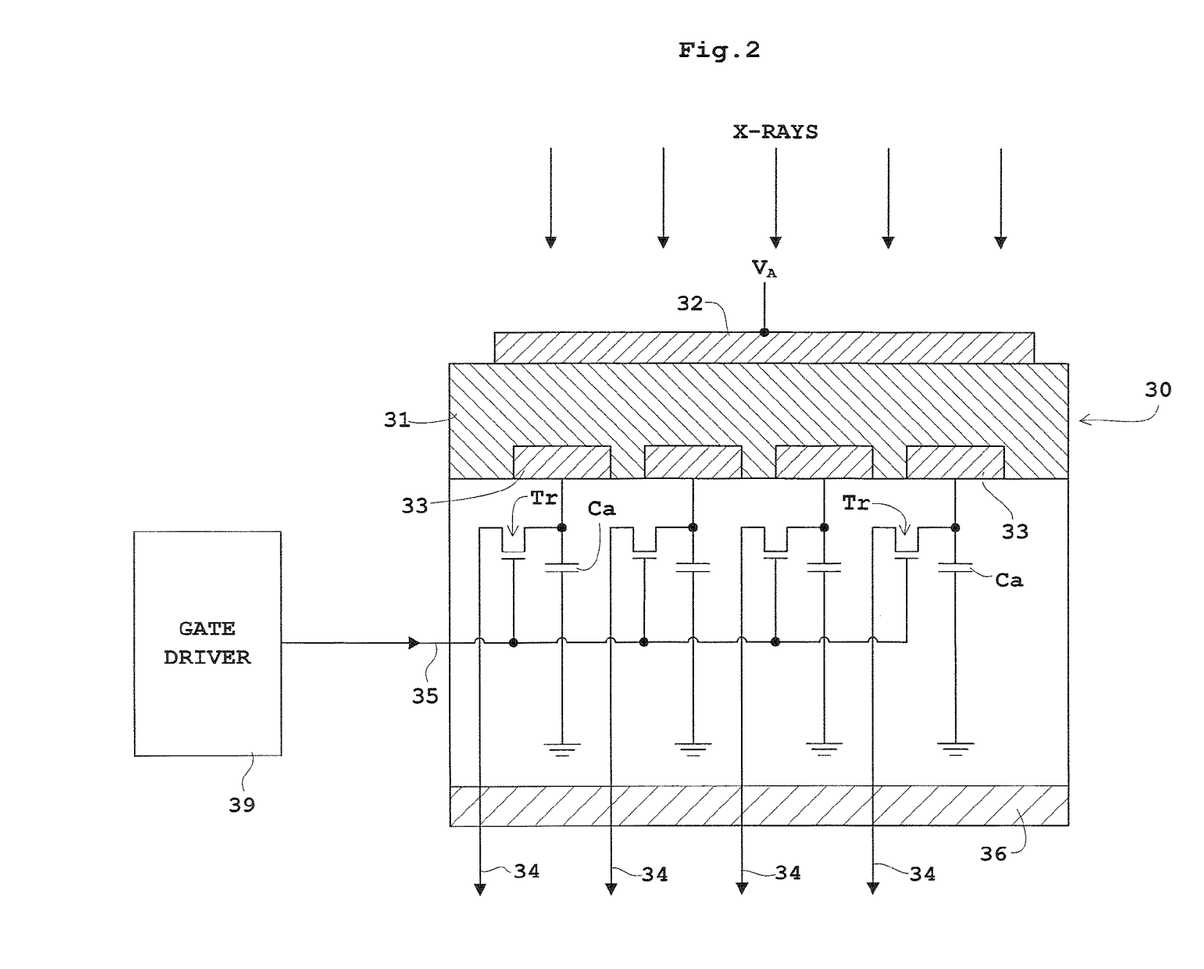
FIG. 2 is a block diagram showing an equivalent circuit of FIG. 1.
Figure 3:
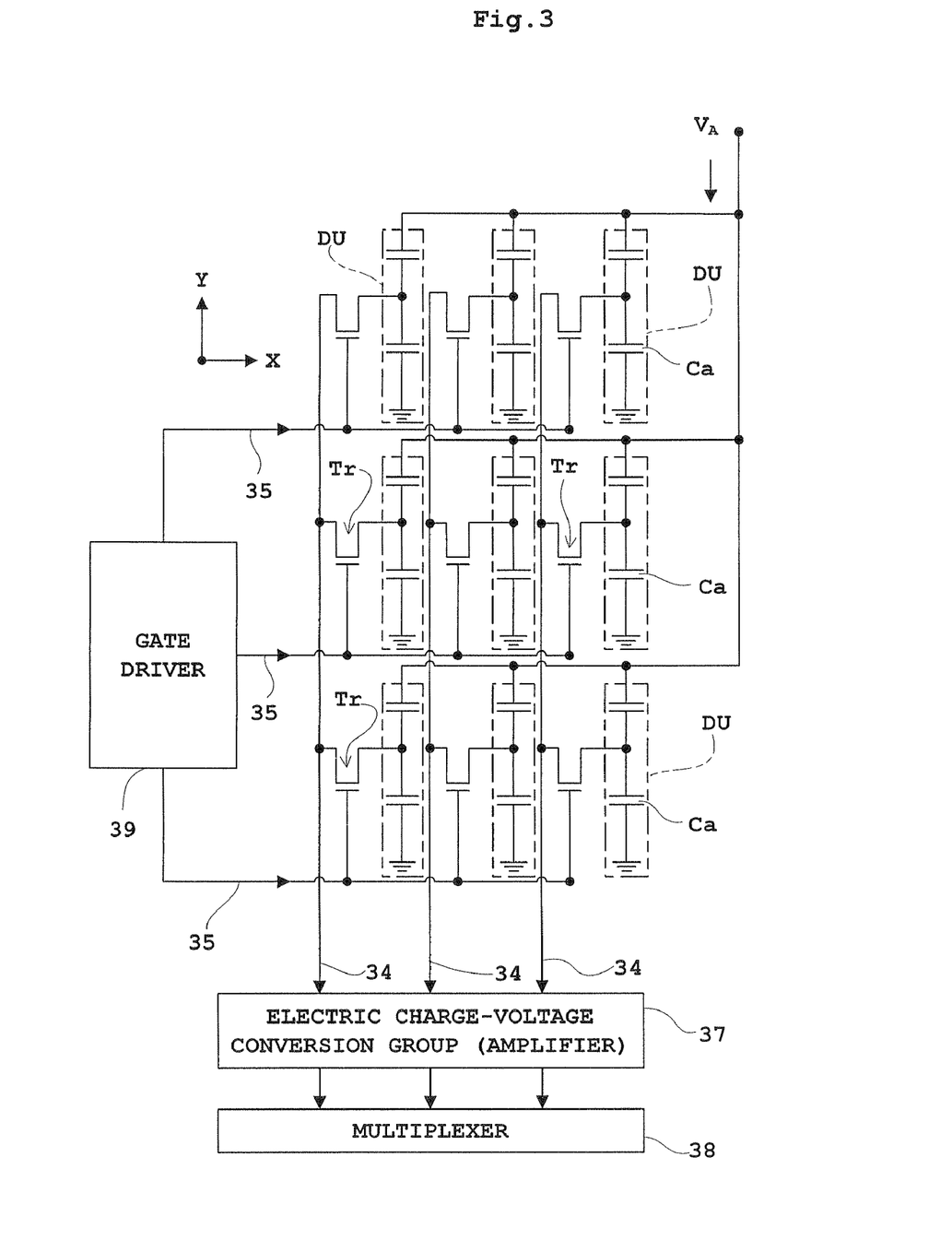
FIG. 3 is a plan view of the circuit.

Embodiment of this invention will be described in detail hereinafter with reference to the drawings. FIG. 1 is a schematic sectional view of a radiation detector according to Embodiment. FIG. 2 is a block diagram showing an equivalent circuit of FIG. 1. FIG. 3 is a plan view of the circuit. In the Embodiment, a direct conversion type radiation detector will be described by way of example.

As shown in FIGS. 1 and 2, the radiation detector 30 of the Embodiment includes a radiation sensitive type semiconductor thick film 31 in which carriers are generated upon incidence of radiation such as X-rays, a voltage application electrode 32 provided on a surface of the semiconductor thick film 31, carrier collection electrodes 33 provided on a rear face opposite to a radiation incident side of the semiconductor thick film 31, capacitors Ca for electric charge accumulation to accumulate the carriers collected to the carrier collection electrodes 33, and thin film transistors (TFT) Tr, acting as switch elements for fetching the electric charges, that are OFF (cutoff) in normal times to fetch the electric charges accumulated in the capacitors Ca. This embodiment has the semiconductor thick film 31 formed of a radiation sensitive material to generate carriers upon incidence of radiation. The semiconductor thick film 31 may be of a light sensitive material to generate carriers upon incidence of light. Here, the semiconductor thick film 31 corresponds to the conversion layer in this invention, and the voltage application electrode 32 to the voltage application electrode in this invention.

In addition, the radiation detector 30 further includes data lines 34 connected to sources of the thin film transistors Tr and gate lines 35 connected to gates of the thin film transistors Tr. The voltage application electrode 32, semiconductor thick film 31, carrier collecting electrodes 33, capacitors Ca, thin film transistors Tr, data lines 34, and gate lines 35 are laminated on an insulating substrate 36. The insulating substrate 36 is formed, for example, of a glass substrate.

As shown in FIGS. 2 and 3, each of the capacitors Ca and thin film transistors Tr mentioned above is connected to each of numerous carrier collecting electrodes 33 arranged in a two-dimensional matrix of row and columns (e.g. 1,024×1,024.) These carrier collection electrodes 33, capacitors Ca, and thin film transistors Tr each separately formed to act as detecting elements DU. The voltage application electrode 32 is formed entirely as a common electrode of all the detecting elements DU. As shown in FIG. 3, two or more data lines 34 mentioned above are arranged in parallel in a horizontal direction (X), and two or more gate lines 35 mentioned above in parallel in a longitudinal direction (Y), as also shown in FIG. 3. Each of the data lines 34 and gate lines 35 is connected to each detecting element DU. The data lines 34 are connected to a multiplexer 38 via an electric charge-voltage conversion group (amplifier) 37, and the gate lines 35 are connected to a gate driver 39. Here, an arrangement number of the detecting elements DU is not limited to 1,024×1,024 as mentioned above. The arrangement number may be modified for use in accordance with embodiments. Consequently, the number of the detecting elements DU may be one.

The detecting elements DU are patterned on the insulating substrate 36 in a two-dimensional matrix arrangement. The insulating substrate 36 with the detecting elements DU patterned thereon is also called an "active matrix substrate." The insulating substrate 36 with the detecting elements DU patterned thereon corresponds to the read out substrate in this invention.

The electric charge-voltage conversion group (amplifier) 37 and multiplexer 38 are placed on a flexible substrate (not shown) formed of an elastomer, in turn, from the insulating substrate 36 side. The flexible substrate is electrically connected to the data lines 34 (see FIG. 1) formed on the insulating substrate 36 as minute charge signal lines.

In manufacturing the radiation detector 30 formed of the semiconductor thick film 31 and insulating substrate 36, the data lines 34 and gate line 35 are installed, using thin film formation techniques with vacuum evaporation methods or pattern techniques with photolithographic methods, and the thin film transistors Tr, capacitors Ca, carrier collection electrodes 33, semiconductor thick film 31, and voltage application electrode 32, are laminated in turn. Here, the semiconductor that forms the semiconductor thick film 31 may be selected as appropriate depending on applications or electric strengths, as exemplified by amorphous semiconductors or polycrystalline semiconductors, etc. Moreover, the material from which the semiconductor thick film 31 is made is not particularly limited, as is exemplified by selenium (Se). In the Embodiment, the radiation detector is of a direct conversion type, and thus the semiconductor thick film 31 is formed of amorphous selenium.

As shown in FIG. 1, for instance, an insulating frame 41 formed of glass is erected around the radiation detector 30 formed of the semiconductor thick films 31 and insulating substrate 36, etc., with an insulating plate 42 formed of glass placed thereon. An insulating resin 43 is poured into a space between the semiconductor thick film 31 or voltage application electrode 32 and the insulating plate 42 for mold sealing. An molding structure 44 is configured by the insulating frame 41, plate 42, and resin 43. The molding structure 44 covers and protects the semiconductor thick film 31 and voltage application electrode 32 via the insulating resin 43. The molding structure 44 corresponds to the molding structure in this invention.

Figure 4:
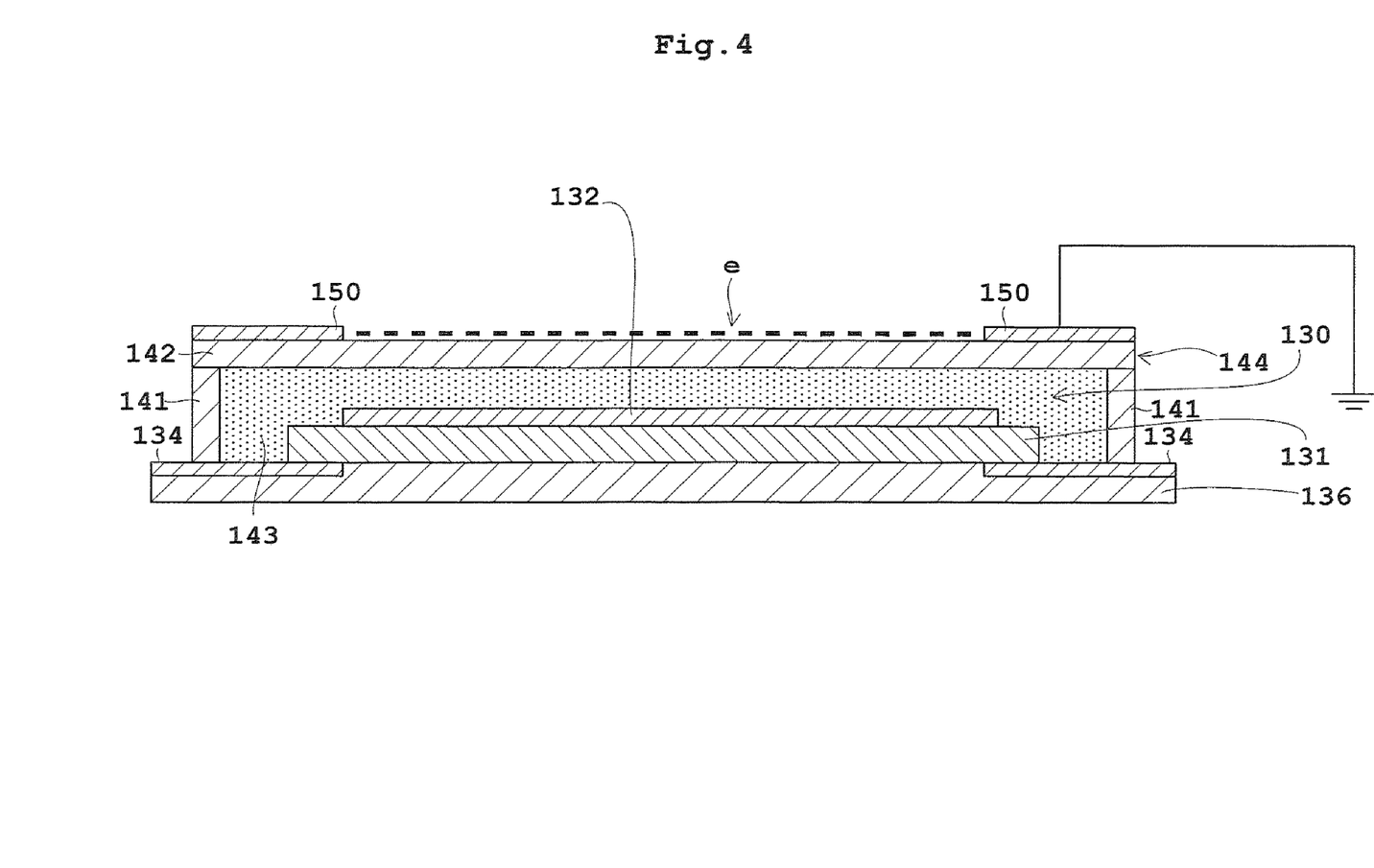
FIG. 4 is a schematic sectional view of a conventional radiation detector for comparison with FIG. 1.

Next, description will be made of the features of the Embodiment, with reference to FIG. 1, and to FIG. 4 for comparison with the conventional art. FIG. 4 is a schematic sectional view of a conventional radiation detector for comparison with FIG. 1. FIG. 4 has a radiation detector 130 corresponding to the radiation detector 30 of FIG. 1, a semiconductor thick film 131 corresponding to the semiconductor thick film 31 of FIG. 1, a voltage application electrode 132 corresponding to the voltage application electrode 32 of FIG. 1, data lines 134 corresponding to the data lines 34 of FIG. 1, an insulating substrate 136 corresponding to the insulating substrate 36 of FIG. 1, a frame 141 corresponding to the frame 41 of FIG. 1, a plate 142 corresponding to the plate 42 of FIG. 1, a resin 143 corresponding to the resin 43 of FIG. 1, and a molding structure 144 corresponding to the molding structure 44 of FIG. 1. FIG. 4 shows an improved radiation detector of patent document 2 mentioned above.

The Embodiment differs from the conventional art in its having a conductive sponge 45 and conductive carbon member 46, and a lower resistance toward the incident side, as shown in FIG. 1. The conventional art, as shown in FIG. 4, has a conductive low potential ground 150 laminated on an incident surface side of the plate 142 of the molding structure 144. The low potential ground 150 is grounded that is provided on a portion of minute charge signal lines in the data lines 134 for reduction in influence of static electricity. Arrangement of the low potential ground 150 realizes removal of the static electricity e charged in the molding structure 150 as mentioned above. In FIG. 4, however, all the static electricity e occurred cannot be removed.

On the other hand, the Embodiment has the planar conductive sponge 45 laminated on the incident surface of the plate 42 of the molding structure 44, as shown in FIG. 1. The planar conductive carbon member 46 is laminated on the incident surface side of the conductive sponge 45. The conductive sponge 45 has a function as a buffer. Each of the molding structure 44, conductive sponge 45, and conductive carbon 46 is formed such that the molding structure 44 has resistance higher than the conductive sponge 45 and the conductive sponge 45 has resistance higher than the conductive carbon member 46. Polyethylene foam is used, for example, as the conductive sponge 45. Here, the conductive sponge 45 corresponds to the first member in this invention, and the conductive carbon member 46 to the second member in this invention.

Specifically, the molding structure 44 is preferably of resistance in a range of 1 MΩ to 100 MΩ, inclusive, the conductive sponge 45 preferably of 0.5 MΩ to 10 MΩ, inclusive, and the conductive carbon member 46 preferably of 0.1 KΩ to 1 MΩ, inclusive.

In particular, an antistatic coating agent to be applied is atomized on for spraying and application on the incident surface of the plate 42 of the molding structure 44. Examples of the atomized antistatic coating agent include model "FC-172 FINE ESD coat" (production of Fine Chemical Japan Co., Ltd.) that contains zinc oxide, antimony oxidation, silicone resin, isopropanol, 1-butanol, and carbon dioxide gas. It is high pressurized with carbon dioxide gas for spraying to be applied on the incident surface of the plate 42 of the molding structure 44, thereby forming an antistatic coating film 44a. The antistatic coating film 44a corresponds to the object to be applied in this invention.

Repeat is preferably made of a process to atomize the antistatic coating agent as the object to be applied by spraying and application. Where the model "FC-172 FINE ESD coat" mentioned above is applied to the substrate of an acrylic plate, once application by a spray results in formation of the antistatic coating film having thickness of approximately 1 micrometer. In addition, where the model "FC-172 FINE ESD coat" is applied to the substrate of the acrylic plate, once application by a spray results in a surface resistivity of $5\times10^7 \Omega/\square$, and twice application by a spray results in a surface resistivity of $2\times10^7 \Omega/\square$. Consequently, frequencies of an application process (i.e., frequencies of additional coats) may just be determined such that the molding structure has resistance within a range of 1 MΩ to 100 MΩ, inclusive, as mentioned above, in consideration of resistance, area, or thickness of a material used as a substrate (the plate 42 formed of a glass in Embodiment), or surface resistance of the antistatic coating agent, etc. Where multiple-times application (additional coats) of the antistatic coating agent is made by a spray that is represented by model "FC-172 FINE ESD coat", applying after drying it once is preferable.

In the Embodiment, the conductive carbon 46 is contacted with a tape of low specific resistance, such as a copper (Cu) tape, that is grounded.

Next, operations of the radiation detector 30 will be described. Radiation to be detected enters with a high bias voltage $V_A$ (for example, around several hundreds V to several tens kV) applied to the voltage application electrode 32.

Incidence of radiation leads to generation of carriers, and the carriers are accumulated as charge information in the capacitors Ca for accumulating electric charges. The gate lines 35 are selected in accordance with scanning signals for fetching signals from the gate driver 39, and the detecting elements DU connected to the selected gate lines 35 are selectively specified. The electric charges accumulated in the capacitors Ca of the specified detecting elements DU are read out into the data lines 34 via the thin film transistors Tr that turned into ON state with the signals from the selected gate lines 35.

Each detecting element DU is addressed in accordance with the scanning signals from the data lines 34 and gate lines 35 for fetching the signals. When the scanning signals for fetching the signals are sent into the multiplexer 38 and gate driver 39, each detecting element DU is selected from the gate driver 39 in accordance with the scanning signals in a longitudinal (Y) direction. Subsequently, the multiplexer 38 is switched in accordance with the scanning signals in a horizontal (X) direction, and then the electric charges accumulated in the capacitors Ca of the selected detecting elements DU are sent out via the data lines 34, electric charge-voltage conversion group (amplifier) 37 and multiplexer 38, in turn.

For instance, where the radiation detector 30 according to the Embodiment is used for detecting fluoroscopy X-ray images with fluoroscopic X-ray apparatus, charge information is converted into image information in an image processor (not shown) via the data lines 34, and outputted as X-ray radioscopy images.

With the radiation detector 30 with the above configuration according to the Embodiment, each of the molding structure 44, the conductive sponge 45, and the conductive carbon member 46 is formed such that the molding structure 44 to protect the semiconductor thick layer 31 and voltage application electrode 32 has the resistance higher than the conductive sponge 45 composed of the planar conductive buffer that is laminated on the incident surface side of the plate 42 of the molding structure 44, and that the conductive sponge 45 mentioned above has the resistance higher than the conductive carbon member 46 composed of the planar conductive member that is laminated on the incident surface side of the conductive sponge 45.

Static electricity occurred in the molding structure 44 may be dissipated to the conductive sponge 45 and further to the conductive carbon member 46, using a phenomenon in which static electricity flows from a higher resistance to a lower one, thereby leading to removal of the static electricity occurred in the molding structure 44. Moreover, the planar structure of each member (the plate 42 of the molding structure 44, conductive sponge 45, and conductive carbon member 46) results in gradual removal of the static electricity. Furthermore, the conductive sponge 45 between the molding structure 44 and the conductive carbon member 46 is a buffer, and thus improved adhesion may be realized. Here, where a metal thin film tape, such as so-called an adhesive tape having thickness of several hundred micrometers that is formed of aluminum (Al) or copper (Cu), is used instead of the conductive sponge 45, the amount of the incident X-rays decays, thereby leading to not only slight reduction in the amount of read-out signals but also increased risk of discharge due to concentration of the electric lines of force. In contrast, the conductive sponge 45 is a buffer, and thus there is no possibility of reduction in the amount of read-out signals and concentration of the electric lines of force. In addition, there is no risk of discharges. Consequently, occurrence of the noise from the static electricity can be suppressed.

In the Embodiment, the molding structure 44 is preferably of resistance in a range of 1 MΩ to 100 MΩ, inclusive, the conductive sponge 45 preferably of 0.5 KΩ to than 10 MΩ, inclusive, and the conductive carbon member 46 preferably of 0.1 KΩ to 1 MΩ, inclusive. Each resistance lower than the above range leads to a large amount of movement of the static electricity, and thus sudden changes thereof may occur. Each resistance higher than the above range makes it difficult to completely remove the static electricity charged. Consequently, the static electricity is likely to be constantly charged, leading to rise of the electric potential, conversely. That is, a similar phenomenon occurs as the static electricity is charged in the molding structure 44, which results in impossibility to suppress influences of the noise from the static electricity. On the other hand, with each resistance within the range mentioned above, the static electricity may be removed while the movement speed thereof being moderately suppressed, leading to reduction in changes of the static electricity. Consequently, occurrence of the noise may be suppressed.

In the Embodiment, the conductive carbon member 46 is preferably grounded. With such configuration, the static electricity may be dissipated into the conductive carbon member 46 may be dissipated through the grounded portion, and noises rather than the static electricity may also be suppressed. Thus, a certain effect may be desired.

It is useful to apply a direct conversion type radiation detector 30 as in the Embodiment. Specifically, the semiconductor thick film 31 is of a radiation sensitive type that directly converts the information on radiation into charge information (carriers), and the detector is a direct conversion type radiation detector 30 having the radiation sensitive type semiconductor thick film 31. In the direct conversion type radiation detector 30, a higher bias voltage (for example, around several hundreds V to several tens kV) is applied to the voltage application electrode 32, and therefore to the semiconductor thick film 31. Consequently the static electricity is likely to be generated in the molding structure 44. This invention, however, may remove the static electricity in the molding structure 44 to suppress the noise from the static electricity.

In the Embodiment, the molding structure 44 is preferably configured so as to have resistance higher than the conductive sponge 45 by atomization of the object to be applied by spraying and application thereof to the incident surface of the plate 42 of the molding structure 44. Through atomization of the object to be applied by spraying and application thereof to the incident surface of the plate 42 of the molding structure 44, the radiation to be detected may enter with no block by the molding structure 44. A process is preferably repeated to atomize the antistatic coating agent by spraying and application thereof. Through repeat of the process to atomize the object to be applied by spraying and application thereof, the molding structure 44 may be configured having a specific thickness and resistance with a specific value.

The conductive sponge 45 is formed of polyethylene foam, and thus radiation is hardly blocked. Moreover, the conductive carbon member 46 is laminated on the incident surface side of the conductive sponge 45, and similarly radiation is hardly blocked.

This invention is not limited to the foregoing embodiment, but may be modified as follows.

(1) The above Embodiment of this invention applies to the direct conversion type radiation detector that converts incident radiation into charge information directly through the semiconductor thick film 31 (conversion layer.) This invention may apply to an indirect conversion type radiation detector in which incident radiation is converted into light by the scintillator, and the light is converted into charge information by the semiconductor layer formed of a light sensitive material, when it has the voltage application electrode for applying the bias voltage to the conversion layer. Moreover, this invention may apply to the light detector that converts incident light into charge information by the semiconductor layer formed of a light sensitive material. In the indirect conversion type radiation detector, a scintillator and a semiconductor layer formed of a light sensitive material corresponds to the conversion layer in this invention.

(2) In the Embodiment mentioned above, detecting X-rays has been described by way of example. This invention may also apply to a detector that detects gamma rays used for a nuclear medicine device, etc.

(3) In the above Embodiment, the conductive sponge 45 has been described as the first member in this invention by way of example. The first member is not particularly limited, as is exemplified by the member in which an electrically conductive filler is added to a gelatinous material or elastomer, when it is a member formed of a planar conductive buffer.

(4) In the above Embodiment, the conductive carbon member has been described as the second member in this invention as way of example. The second member is not particularly limited, as is exemplified by a metal rather than carbon, when it is a planar conductive member.

(5) In the above Embodiment, the second member (the conductive carbon 46 member in Embodiment) is grounded. It is not always necessary for the second member to be grounded. The second material may be of low potentials.

(6) In the above Embodiment, the object to be applied is atomized by spraying and application to the incident surface of the molding structure. The plate 42 (see FIG. 1) of the molding structure may be integrally formed, for example, when the molding structure has resistance higher than the first member (the conductive sponge 45 in Embodiment.)

The invention claimed is:

1. A light or radiation detector to detect light or radiation, comprising a conversion layer to convert information on the light or radiation into charge information upon incidence of the light or radiation, a voltage application electrode to apply a bias voltage to the conversion layer, a molding structure to protect the conversion layer and the voltage application electrode, and a read-out substrate to read the charge information, the light or radiation detector further comprising a first member composed of a planar conductive buffer that is laminated on a side of the incident surface of the molding structure, and a second member composed of a planar conductive member that is laminated on a side of the incident surface of the first member, each of the molding structure, the first member, and the second member being formed such that the molding structure has resistance higher than the first member and the first member has resistance higher than the second member.

2. The light or radiation detector according to Claim 1, wherein the molding structure is of resistance in a range of 1 M$\Omega$ to 100 M$\Omega$, inclusive, the first member is of resistance in a range of 0.5 K$\Omega$ to 10 M$\Omega$, inclusive, and the second member is of resistance in a range of 0.1 K$\Omega$ to 1 M$\Omega$, inclusive.

3. The light or radiation detector according to claim 1, wherein the second member is grounded.

4. The light or radiation detector according to claim 1, wherein the conversion layer is of a radiation sensitive type that directly converts the information on radiation into charge information, and the detector is a direct conversion type radiation detector having the radiation sensitive type conversion layer.

5. A method of manufacturing a light or radiation detector to detect light or radiation, the detector comprising a conversion layer to convert information on the light or radiation into charge information upon incidence of the light or radiation, a voltage application electrode to apply a bias voltage to the conversion layer, a molding structure to protect the conversion layer and the voltage application electrode, and a read-out substrate to read the charge information, the method including the steps of laminating a first member composed of a planar conductive buffer on a side of the incident surface of the molding structure, and laminating a second member composed of a planar conductive member on a side of the incident surface of the first member, each of the molding structure, the first member, and the second member being formed such that the molding structure has resistance higher than the first member and the first member has resistance higher than the second member.

6. The method of manufacturing the light or radiation detector according to claim 5, wherein the molding structure is configured so as to have resistance higher than the first member by atomization of an object to be applied by spraying and application thereof to the incident surface of the molding structure.

7. The method of manufacturing the light or radiation detector according to claim 6, wherein the molding structure is configured so as to have resistance higher than the first member through repeat of a process to apply the object to be applied by spraying and application thereof.

* * * * *